United States Patent
Ni et al.

(10) Patent No.: US 7,649,742 B2
(45) Date of Patent: *Jan. 19, 2010

(54) THIN FLASH-HARD-DRIVE WITH TWO-PIECE CASING

(75) Inventors: Jim Chin-Nan Ni, San Jose, CA (US);
Abraham C. Ma, Fremont, CA (US);
Charles C. Lee, Cupertino, CA (US);
Ming-Shiang Shen, Taipei Hsien (TW)

(73) Assignee: Super Talent Electronics, Inc., San Jose, CA (US)

( * ) Notice: Subject to any disclaimer, the term of this patent is extended or adjusted under 35 U.S.C. 154(b) by 590 days.

This patent is subject to a terminal disclaimer.

(21) Appl. No.: 11/309,843

(22) Filed: Oct. 11, 2006

(65) Prior Publication Data
US 2007/0274032 A1   Nov. 29, 2007

Related U.S. Application Data

(63) Continuation-in-part of application No. 09/478,720, filed on Jan. 6, 2000, now Pat. No. 7,257,714, and a continuation-in-part of application No. 10/789,333, filed on Feb. 26, 2004, now Pat. No. 7,318,117, and a continuation-in-part of application No. 10/799,039, filed on Mar. 11, 2004, now abandoned, and a continuation-in-part of application No. 10/990,887, filed on Nov. 16, 2004, now Pat. No. 7,301,776.

(51) Int. Cl.
*H05K 1/14* (2006.01)

(52) U.S. Cl. ............... 361/752; 361/737; 361/730; 174/520

(58) Field of Classification Search .............. 361/737, 361/752, 730; 174/520
See application file for complete search history.

(56) References Cited

U.S. PATENT DOCUMENTS

| | | | | |
|---|---|---|---|---|
| 5,574,628 | A * | 11/1996 | Persia et al. ............... | 361/737 |
| 5,712,766 | A * | 1/1998 | Feldman ..................... | 361/737 |
| 5,946,714 | A * | 8/1999 | Miyauchi .................... | 711/205 |
| 6,108,209 | A * | 8/2000 | Cox et al. ................... | 361/737 |
| 7,576,990 | B2 * | 8/2009 | Ni et al. ..................... | 361/737 |

* cited by examiner

*Primary Examiner*—Dameon E Levi
(74) *Attorney, Agent, or Firm*—Stuart T. Auvinen; g Patent LLC

(57) ABSTRACT

A flash-memory drive replaces a hard-disk drive using an integrated device electronics (IDE) interface. The flash drive has a printed-circuit board assembly (PCBA) with a circuit board with flash-memory chips and a controller chip. The controller chip includes an input/output interface circuit to an external computer over the IDE interface, and a processing unit to read blocks of data from the flash-memory chips. The PCBA is encased inside an upper case and a lower case, with an IDE connector that fits through and opening between the cases. The cases can be assembled with the PCBA by a snap-together, ultrasonic-press, screw-fastener, or thermal-bond adhesive method. Center lines formed on the inside of the cases fit between rows of flash-memory chips to improve case rigidity. The connector has two rows of pins that straddle the center line of the circuit board for a balanced design.

16 Claims, 13 Drawing Sheets

SNAP-COUPLED TOGETHER METHOD

FIG. 2A

TOP VIEW

FIG. 2B

BOTTOM VIEW

FIG. 2C

BOTTOM VIEW

TOP VIEW

TOP VIEW

BOTTOM VIEW

BOTTOM VIEW

TOP VIEW

THIN FLASH-HARD-DRIVE WITH TWO-PIECE CASING

RELATED APPLICATIONS

This application is a continuation-in-part (CIP) of the co-pending application for "Electronic Data Storage Medium with Fingerprint Verification Capability", U.S. Ser. No. 09/478,720, filed Jan. 6, 2000, and "System and Method for Controlling Flash Memory", U.S. Ser. No, 10/789,333, U.S. Pub. No. 2005/0193161 A1", filed Feb. 26, 2004, and "System and Method for Managing Blocks in Flash Memory", U.S. Ser. No, 10/799,039, U.S. Pub. No. U.S. 2005/0204187 A1, filed Mar. 11, 2004, and "Light-Weight Flash Hard Drive With Plastic Frame", U.S. Ser. No. 10/990,887, filed Nov. 16, 2004.

FIELD OF THE INVENTION

This invention relates to flash-memory hard drives, and more particularly to manufacturing a flash drive with a two-piece casing.

BACKGROUND OF THE INVENTION

Data files stored on a floppy disk or diskette may require a password for access, or may use encryption to secure the data within the file. Confidential documents can be delivered over a network by adding safety seals and impressions. However, the confidential data is at risk due to breaking of the passwords, encryption codes, safety seals and impressions, thereby resulting in unsecure transfer of the information.

Figure 1:
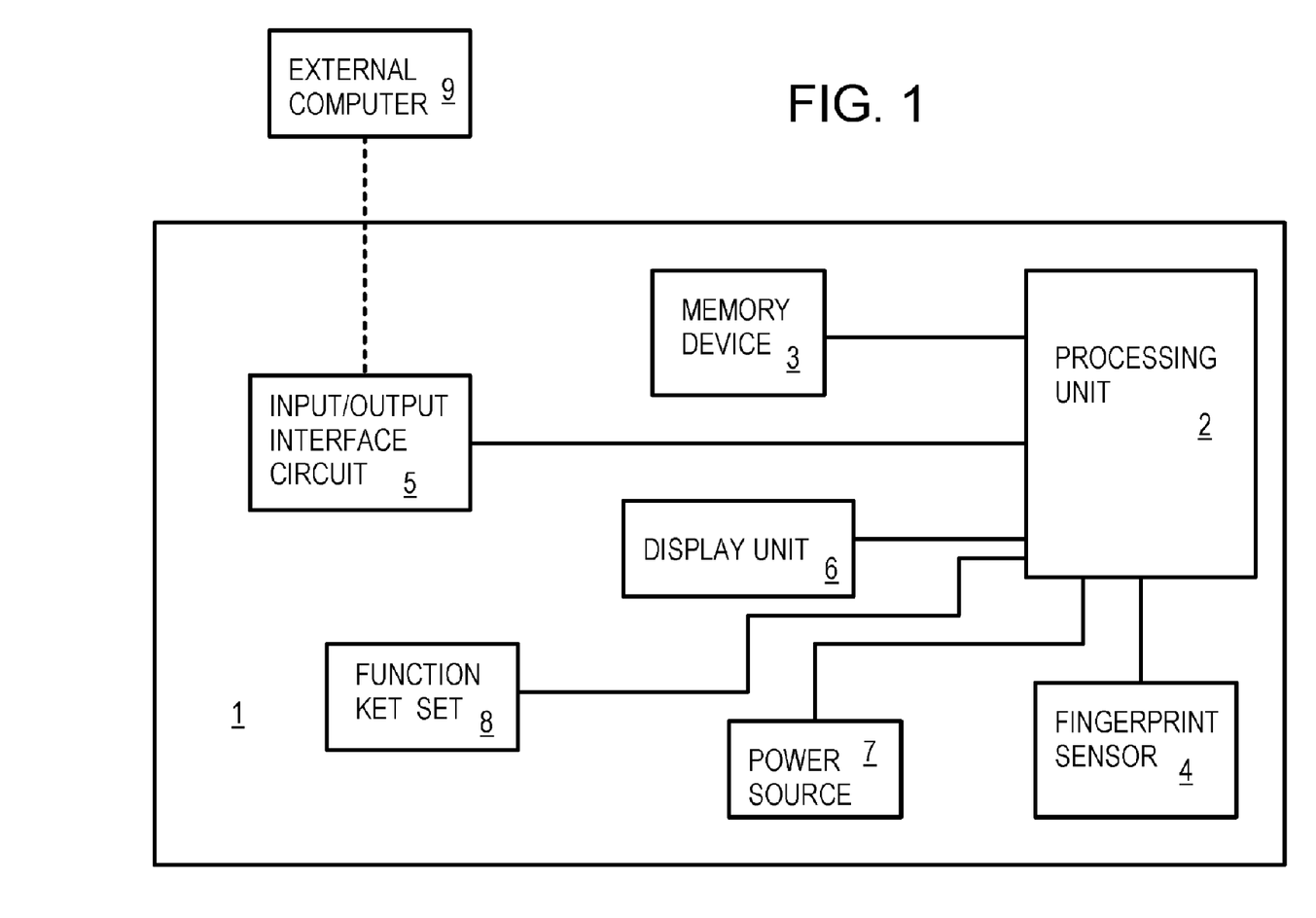
FIG. 1 is a schematic circuit block diagram illustrating an electronic data storage medium disclosed in the parent application.

The parent application disclosed an electronic data storage medium that had fingerprint verification capability. FIG. 1 is a schematic circuit block diagram illustrating an electronic data storage medium disclosed in the parent application.

The electronic data storage medium with fingerprint verification capability can be accessed by external computer 9 using input/output interface circuit 5, which may use a Personal-Computer Memory Card International Association (PCMCIA), RS-232, or similar interface to communicate. The electronic data storage medium can be located inside or outside of the external computer.

The electronic data storage medium is packaged in card body 1, and includes processing unit 2, memory device 3, fingerprint sensor 4, input/output interface circuit 5, display unit 6, power source 7, and function key set 8.

Memory device 3 can be a flash memory device that stores data files. Fingerprint sensor 4 scans a fingerprint of a user to generate fingerprint scan data. Processing unit 2 connects to other components and can operate in various modes, such as a programming mode, a data retrieving mode, and a data resetting mode. Power source 7 supplies electrical power to processing unit 2. Function key set 8 allows the user to input a password that is verified by processing unit 2. Display unit 6 shows the operating status of the electronic data storage medium.

The electronic data storage medium is packaged in card body 1, and includes processing unit 2, memory device 3, and input/output interface circuit 5. While such an electronic data storage medium is useful, manufacturing methods and product designs are desired that can be cost-effectively produced. In particular, designs for making the card body or casing that encapsulates the electronic components are desired. To reduce the cost and size, designs of the electronic data storage medium that eliminate some costly components, such as the fingerprint sensor, function key set, display, are desirable. An external power source may further reduce costs and size. Such device designs may allow a low-cost electronic data storage medium to be manufactured.

DETAILED DESCRIPTION

The present invention relates to an improvement in flash-memory drives. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have developed a variety of manufacturing methods for electronic data storage medium devices such as flash-memory drives that can replace hard disk drives with solid-state flash memory. Flash memory chips currently employ electrically-erasable programmable read-only memory (EEPROM) are the primary storage medium. Such flash memory is more rugged than rotating magnetic disks.

The inventors have realized that the card body may be constructed from a two-piece casing that encloses a printed-circuit board assembly (PCBA) that has a circuit board with the flash-memory chips mounted thereon. The two-piece casing can be assembled together and sealed in a variety of ways, such as with snaps, tabs and slots, ultrasonic ridges, adhesives, and screw fasteners.

FIGS. 2A-E show a flash drive assembled using a snap-coupled process. In the parts view of FIG. 2A, PCBA 40 is enclosed by upper case 20 and lower case 30. PCBA 40 is a circuit board such as a printed-circuit board (PCB) with wiring traces, and has several flash-memory chips 44 and other chips and components soldered to pads on surfaces of the circuit board. PCBA 40 also has connector 46 mounted and soldered to the front edge of the circuit board. Connector 46 has pins 42 that fit into pin-sockets when the flash drive is plugged into a host. Connector 46 can be a flash hard-drive connector such as an integrated device electronics (IDE) or small-computer system interface (SCSI) connector.

Figure 2A:
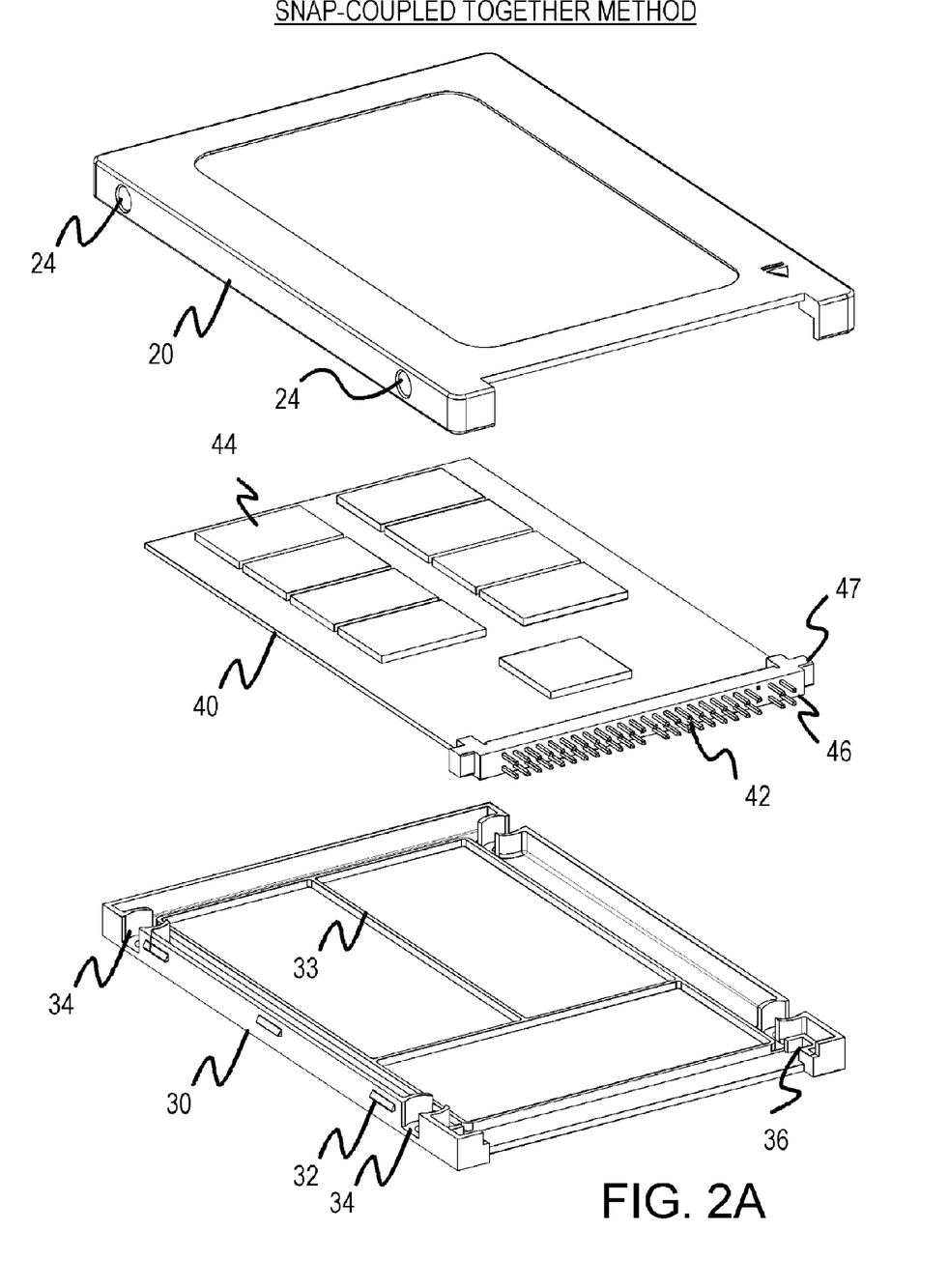
FIGS. 2A-E show a flash drive assembled using a snap-coupled process.

During assembly, PCBA 40 is fitted over lower case 30. Connector 46 has rectangular tabs 47 at both ends that are inserted into rectangular wells 36 formed on the interior of lower case 30. Rectangular tabs 47 fit snugly into rectangular wells 36 to keep PCBA 40 in position inside lower case 30 while upper case 20 is being added to the assembly.

Lower case 30 also has center lines 33 that are raised ridges. Center lines 33 fits between rows of chips 44 when PCBA 40 is fitted into lower case 30. Center lines 33 can be sufficiently tall to reach the lower surface of the circuit board in PCBA 40 to add support of the final assembled flash drive. Center lines 33 can thus prevent the middle of lower case 30 from flexing or dimpling inward when a user pinches together the centers of upper case 20 and lower case 30 of the assembled device. Center lines 33 can thus give the finished device a more rugged and solid feel in the user's hands, increasing the user's perception of quality of the device.

Upper case 20 is then fitted into the sub-assembly of PCBA 40 and lower case 30. Four alignment pegs 24 on upper case 20 fit into four alignment sockets 34 that are formed on the sides of lower case 30 to align upper case 20 during assembly. As upper case 20 is pressed downward during assembly, alignment pegs 24 slide downward into alignment sockets 34. As upper case 20 reaches the fully-inserted position during assembly, locking tabs 32 formed on the outer edges of lower case 30 fit and snap into engagement slots 22 (see FIG. 2C) on upper case 20, locking upper case 20 into lower case 30.

Figure 2B:
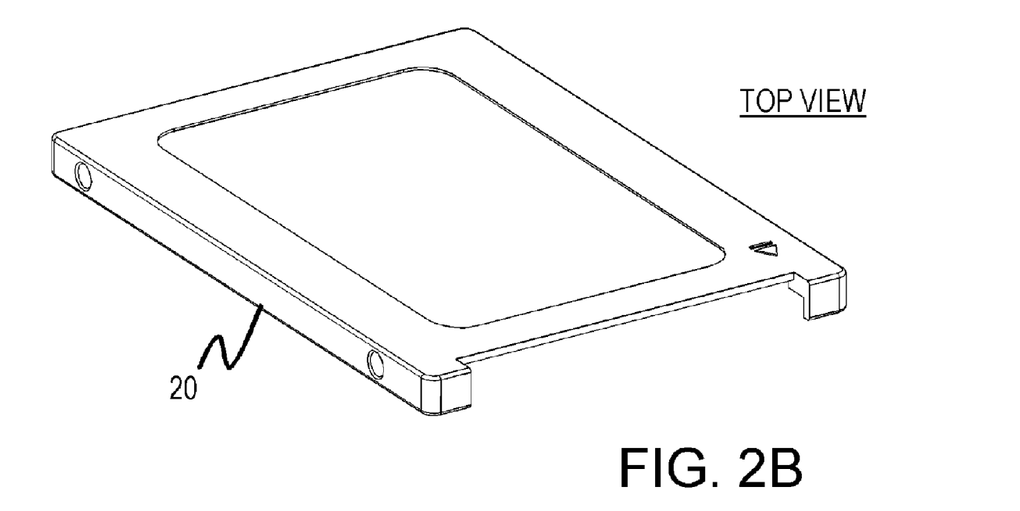
Figure 2C:
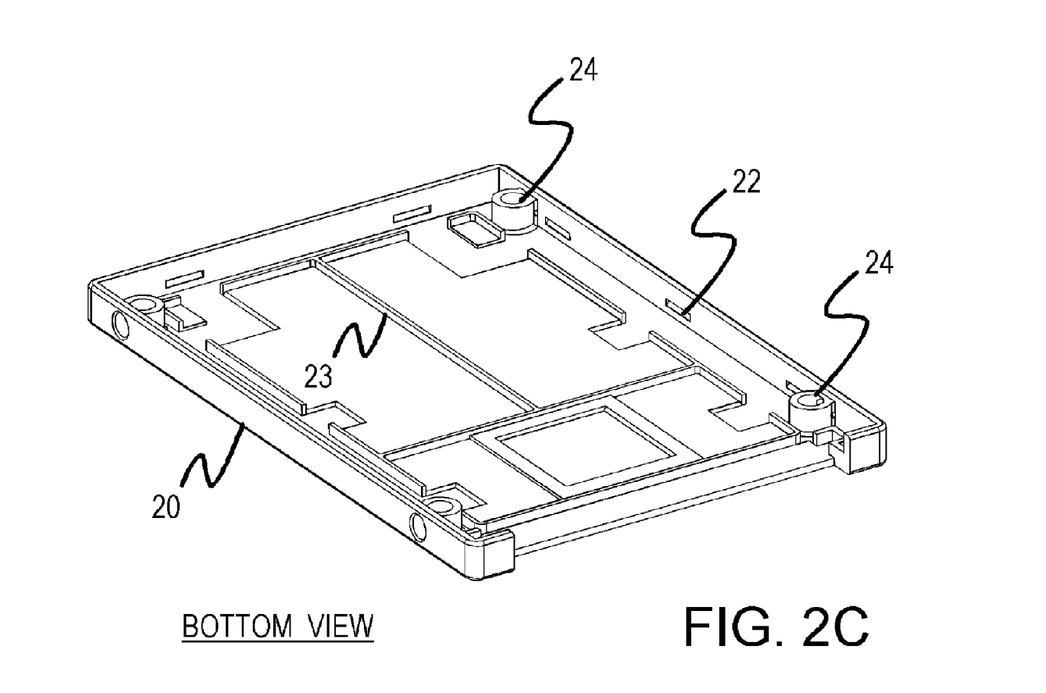

FIG. 2B shows a top view of upper case 20, while FIG. 2C shows a bottom view of upper case 20. Upper case 20 can also have center lines 23 that fit between chips 44 on PCBA 40. Center lines 23 can increase support of upper case 20, in a manner similar to that described for center lines 33 on lower case 30. Engagement slots 22 receive locking tabs 32 to snap-couple together upper case 20 to lower case 30, encasing PCBA 40 so that only connector 46 is visible. Alignment pegs 24 are for fitting onto alignment sockets 34 on lower case 30.

Figure 2D:
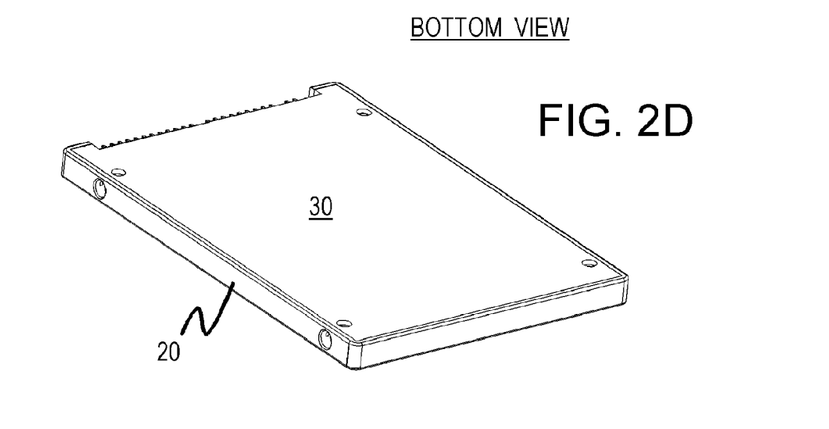

FIG. 2D shows a bottom view of the final assembled flash-drive device, with lower case 30 covering PCBA 40. The side walls visible are from upper case 20, since lower case 30 fits into upper case 20.

Figure 2E:
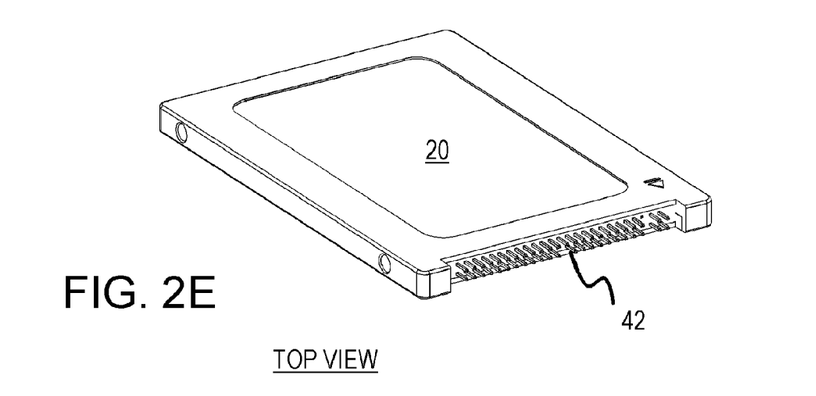

FIG. 2E shows a top view of the final assembled flash-drive device, with upper case 20 covering PCBA 40. Pins 42 of connector 46 extend from a front opening between upper case 20 and lower case 30. The side walls visible are part of upper case 20. Pins 42 can be inserted into a socket such as an IDE socket on a host computer, and can be read as a mass-storage device, replacing a rotating hard disk. Mass-storage devices are read in large blocks or streams of data, rather than as randomly-addressable words.

Figure 3:
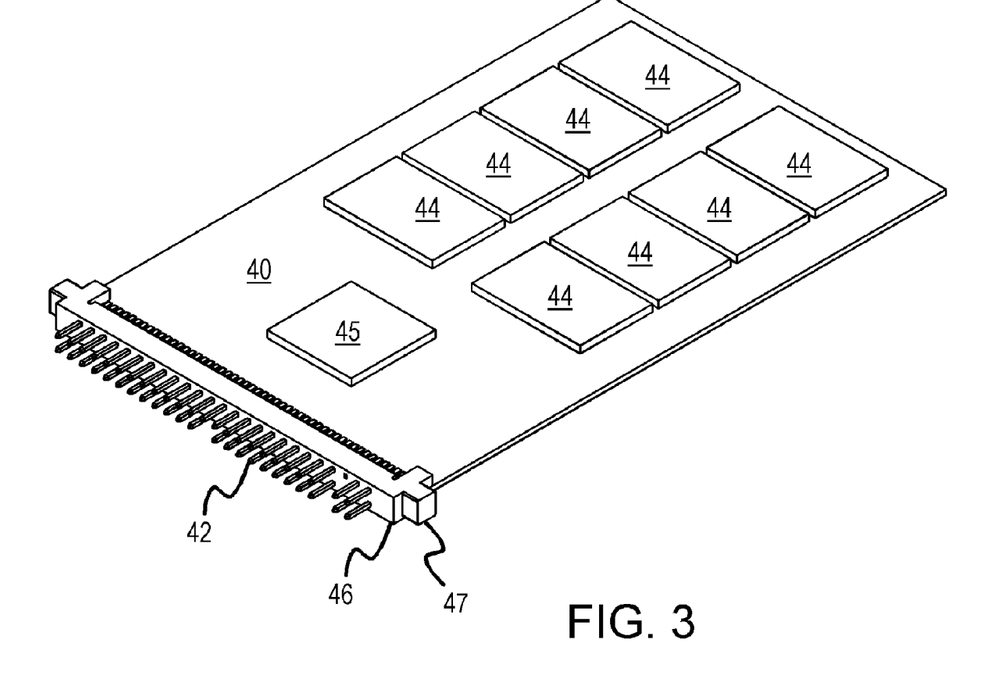
FIG. 3 shows the circuit-board assembly in more detail.

FIG. 3 shows the circuit-board assembly in more detail. PCBA 40 includes a circuit board with wiring traces on several layers, and vias or other inter-layer connections. Several flash-memory chips 44 are arranged in two rows on each side of the circuit board, allowing center lines from the upper and lower cases to fit between. The area on the circuit board that the center lines contact can be free of components such as resistors, capacitors, and chips, or cutouts in the center lines can be made for any such components.

Controller chip 45 is also mounted to the circuit board, between flash-memory chips 44 and connector 46. Controller chip 45 can have an IDE or other bus interface to communicate with a host over pins 42 in connector 46. Controller chip 45 can also have a flash controller that reads, erases, and writes blocks of data to flash-memory chips 44, perhaps including wear-leveling and address re-mapping logic and tables.

Connector 46 has rectangular tabs 47 at both ends that are inserted into rectangular wells 36 formed on the interior of lower case 30 (FIG. 2A). The bottom side of the circuit board (not shown) also has two rows of flash-memory chips 44, but does not have controller chip 45.

Figure 4:
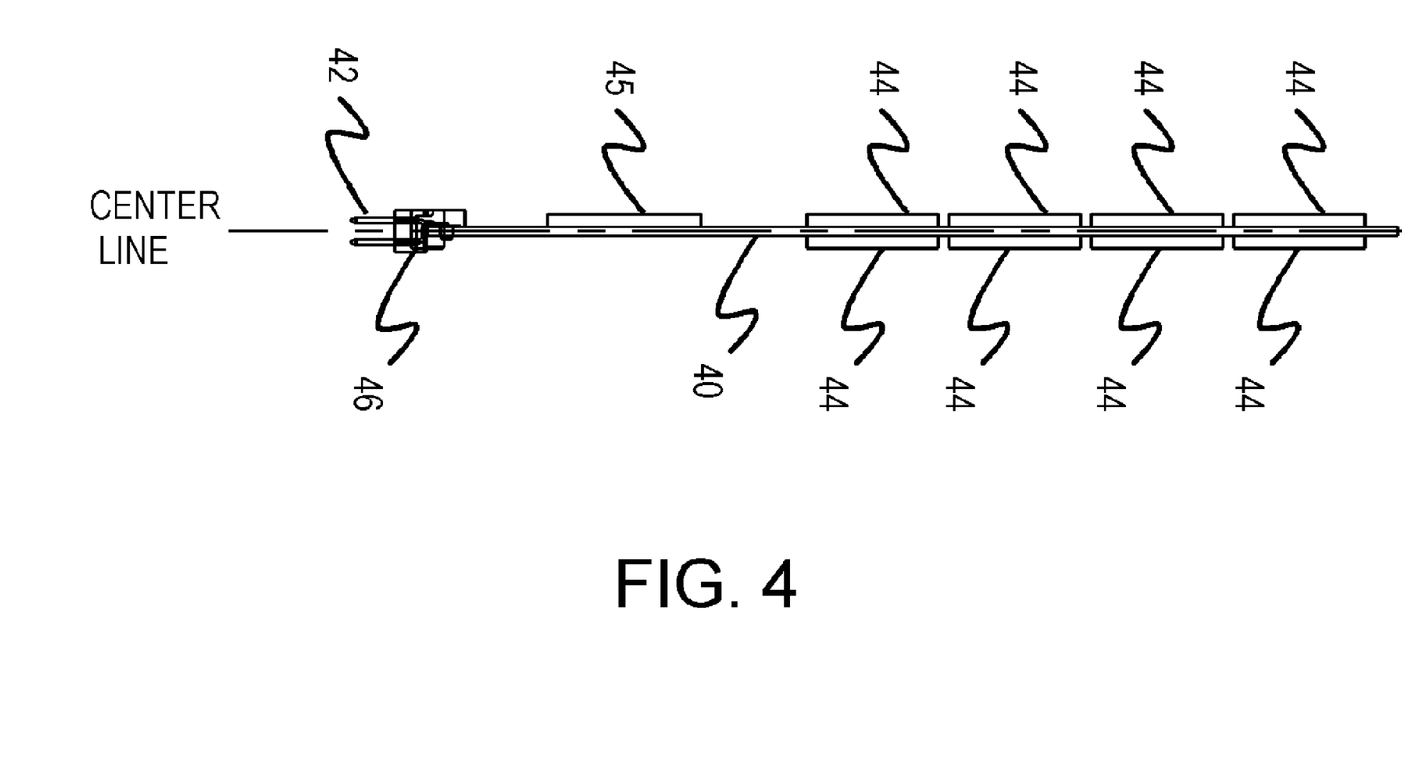
FIG. 4 is a side view of the PCBA.

FIG. 4 is a side view of the PCBA. PCBA 40 has rows of flash-memory chips 44 mounted to both sides, and controller chip 45 mounted to the upper side. Surface-mount technology (SMT) may be used to mount these chips. Connector 46 has two rows of pins 42 and is mounted to an edge of the circuit board. Connector 46 may straddle the edge of the circuit board to allow one row of pins 42 to be on one side of the center-line of circuit board, and the other row of pins 42 to be on the other side of center-line of the circuit board. This straddling mount of connector 46 allows for a flatter and more symmetric design of PCBA 40, reducing overall thickness of the assembled flash device. A balanced design of the flash drive is the result.

FIGS. 5A-E show assembly of the flash device using an ultrasonic press method. In the parts view of FIG. 5A, PCBA 40 is enclosed by upper case 50 and lower case 70. PCBA 40 is a circuit board such as a PCB with wiring traces, and has several flash-memory chips 44 and other chips and components soldered to pads on surfaces of the circuit board. PCBA 40 also has connector 46 mounted and soldered to the front edge of the circuit board. Connector 46 has pins 42 that fit into IDE or SCSI pin-sockets when the flash drive is plugged into a host.

Figure 5A:
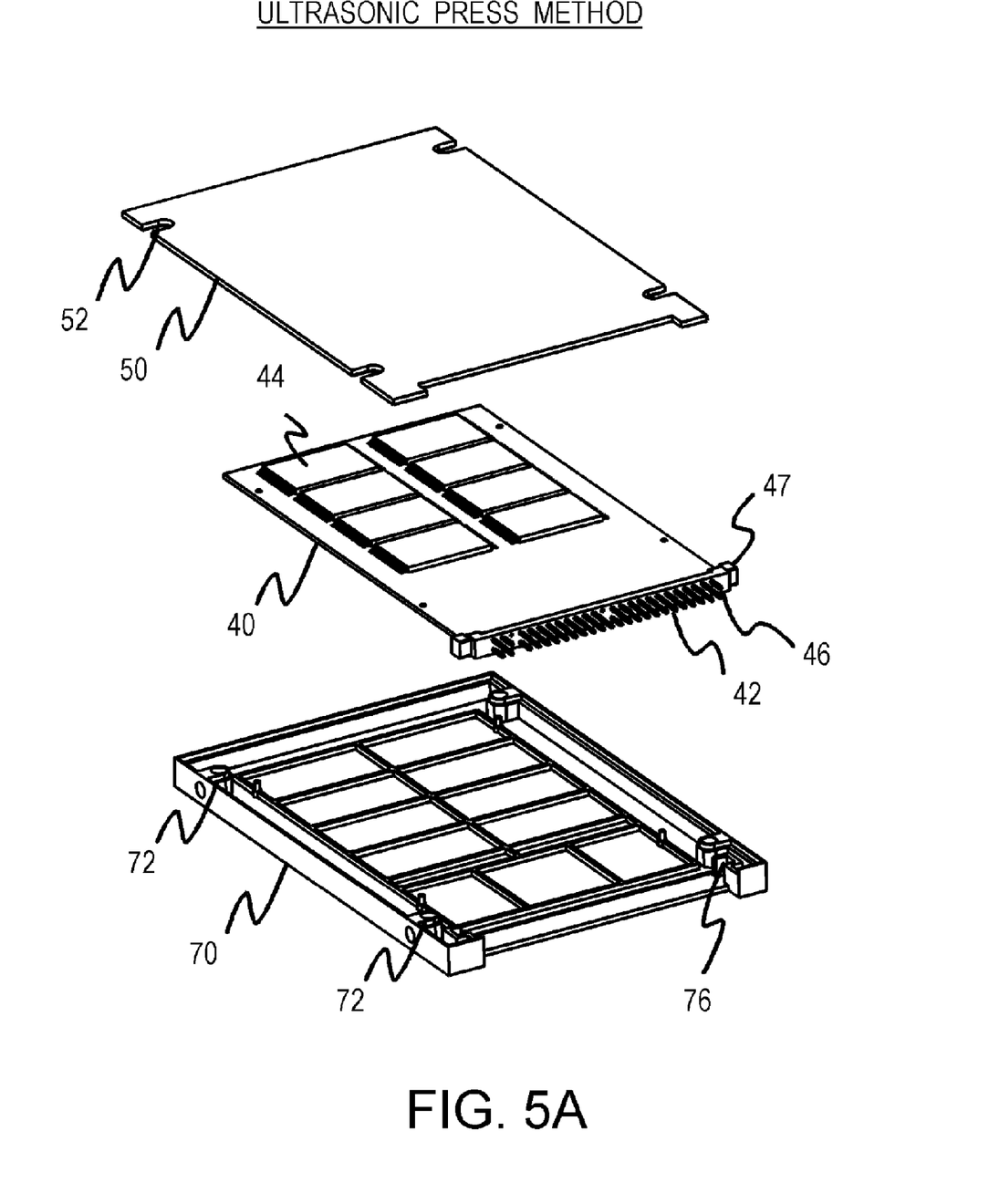
FIGS. 5A-E show assembly of the flash device using an ultrasonic press method.

During assembly, PCBA 40 is fitted over lower case 70. Connector 46 has rectangular tabs 47 at both ends that are inserted into rectangular wells 76 formed on the interior of lower case 70. Rectangular tabs 47 fit snugly into rectangular wells 76 to keep PCBA 40 in position inside lower case 70 while upper case 50 is being added to the assembly.

Upper case 50 is then fitted over the sub-assembly of PCBA 40 and lower case 70. Four alignment cutouts 52 on upper case 50 fit around four alignment tabs 72 that are formed on the sides of lower case 70 to align upper case 50 during assembly. As upper case 50 is pressed downward during assembly, alignment tabs 72 fit inside alignment cutouts 52.

The un-bonded assembly can then be placed in a jig or fixture for ultrasonic bonding. Upper case 50 is rapidly vibrated with respect to lower case 70 by the ultrasonic bonding apparatus while being pressed together. This rapid movement creates friction where upper case 50 touches lower case 70. This localized friction quickly heats up the contacting parts of upper case 50 and lower case 70. In particular, alignment tabs 72 touch the inside of alignment cutouts 52, causing localized heating. This heating eventually melts alignment tabs 72 into alignment cutouts 52, bonding them together.

Figure 5B:
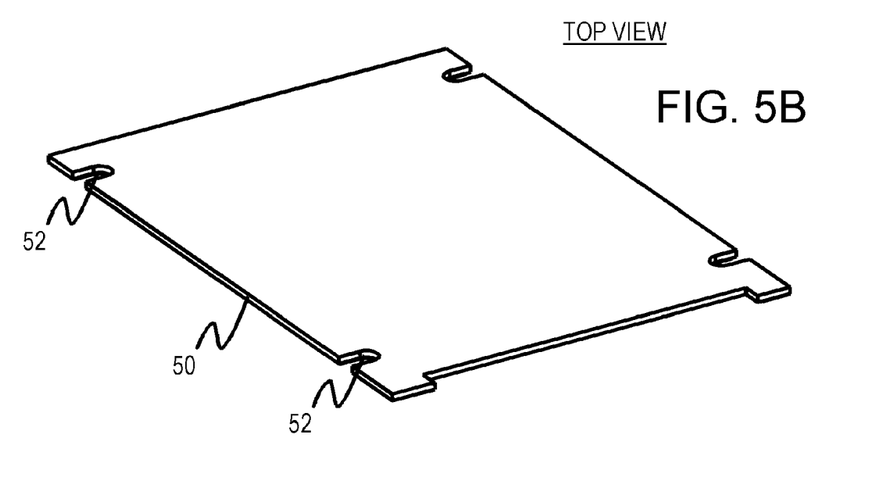
Figure 5C:
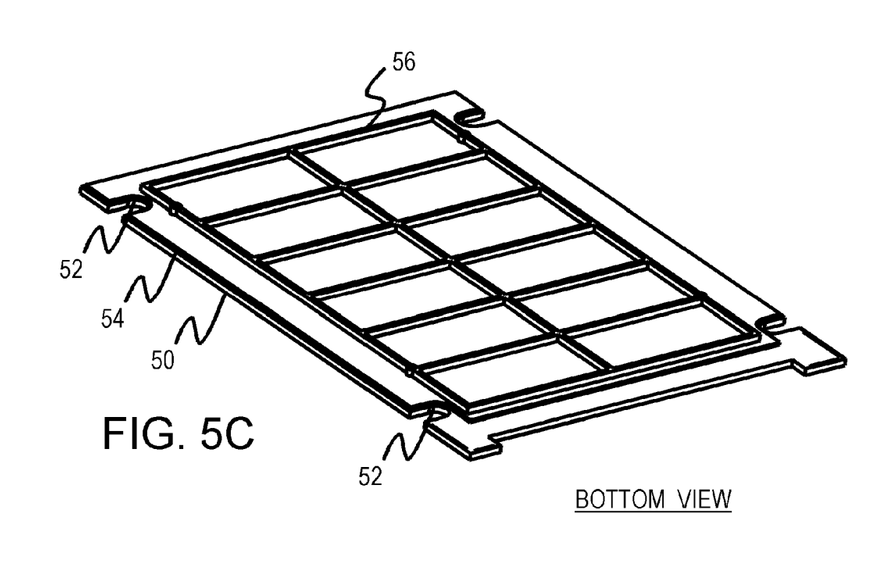

FIG. 5B shows a top view of upper case 50, while FIG. 5C shows a bottom view of upper case 50. In addition to the ultrasonic bonding of alignment tabs 72 into alignment cutouts 52, additional points of contact can be designed into upper case 50.

Ultrasonic ridge 54 can be formed in the underside of upper case 50, around the perimeter as shown in FIG. 5C. Ultrasonic ridge 54 is raised slightly so that it touches the rim of lower case 70, absorbing the ultrasonic energy. Ultrasonic ridge 54 then melts into the rim of lower case 70 during ultrasonic bonding, melding upper case 50 into lower case 70.

Additional ridges 56 can be formed on the underside of upper case 50. These additional ridges 56 can be for stiffening upper case 50 to prevent dimpling or flexing in the user's hands. Additional ridges 56 make contact with PCBA 40 during assembly. Alternately, additional ridges 56 could contact the top of PCBA 40 to secure PCBA 40 into upper case 50. Similar ridges may be formed on the inside of lower case 70, as shown in FIG. 5A.

Figure 5D:
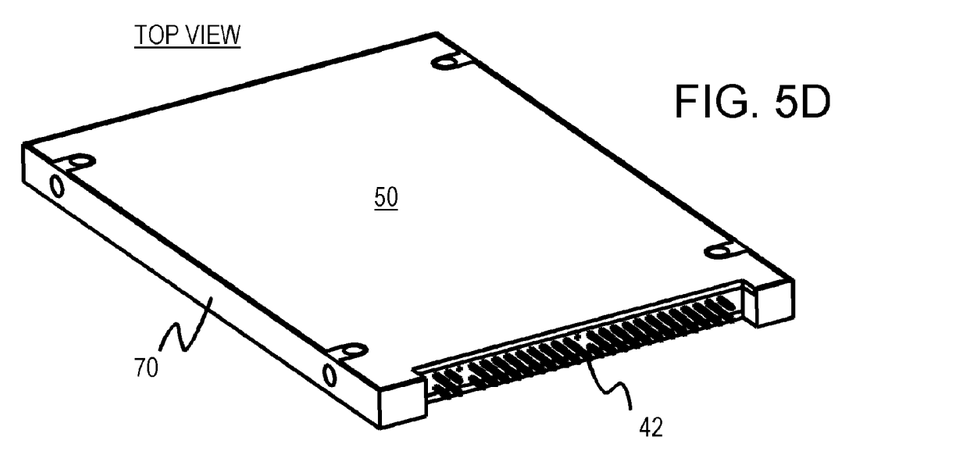

FIG. 5D shows a top view of the final assembled flash-drive device, with upper case 50 covering PCBA 40. Pins 42 of connector 46 extend from a front opening between upper case 50 and lower case 70. The side walls visible are part of lower case 70. Pins 42 can be inserted into a socket such as an IDE socket on a host computer, and can be read as a mass-storage device, replacing a rotating hard disk. Mass-storage devices are read in large blocks or streams of data, rather than as randomly-addressable words.

Figure 5E:
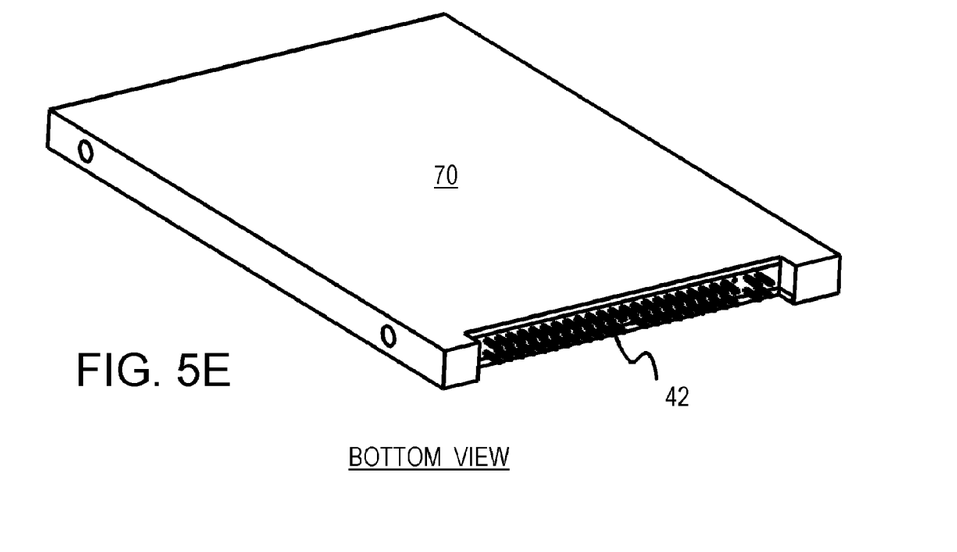

FIG. 5E shows a bottom view of the final assembled flash-drive device, with lower case 70 covering PCBA 40. The side walls visible are from lower case 70, since lower case 70 over upper case 50.

Figure 6A:
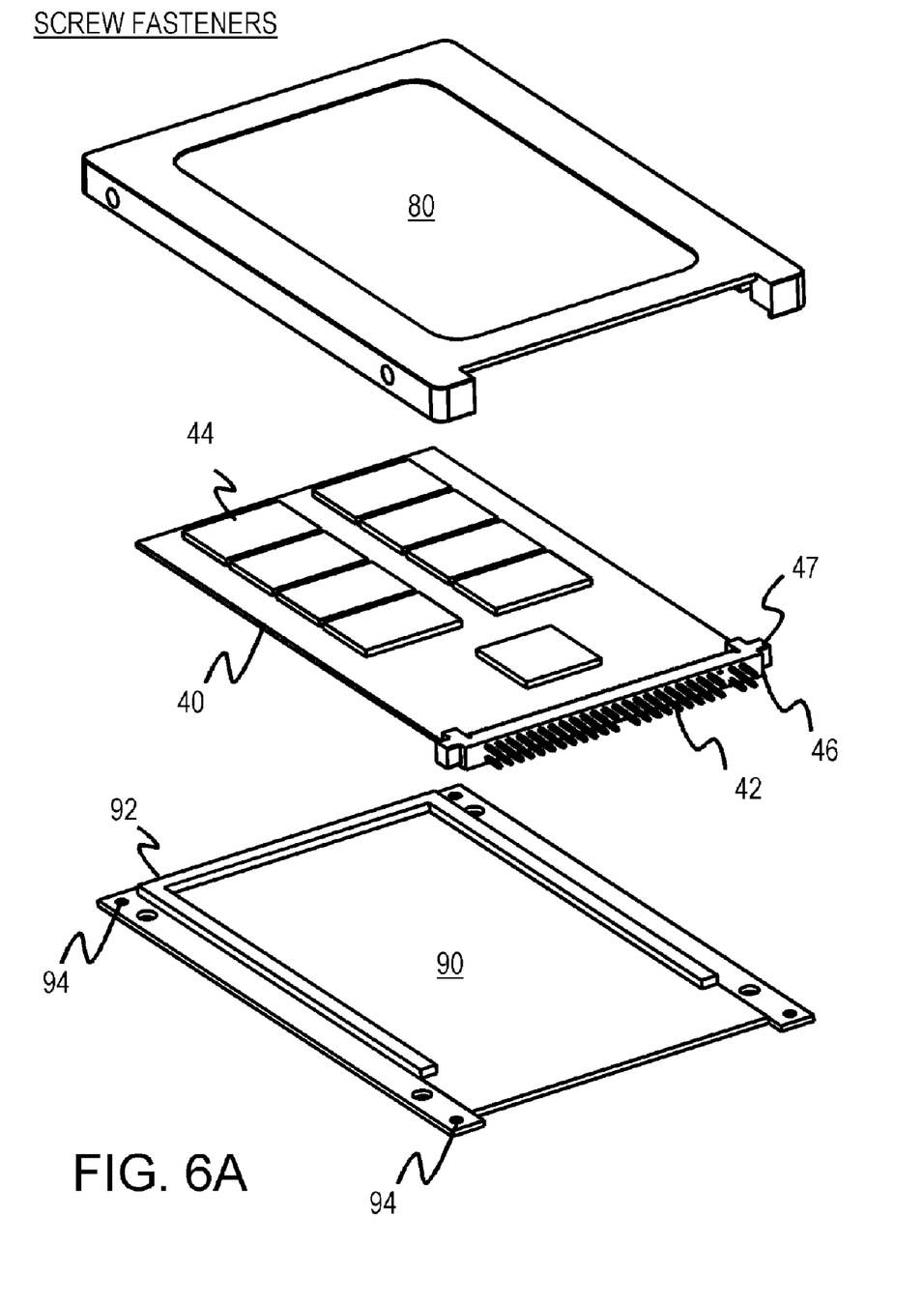
FIGS. 6A-C show a flash drive assembled using a snap-coupled process.
Figure 6B:
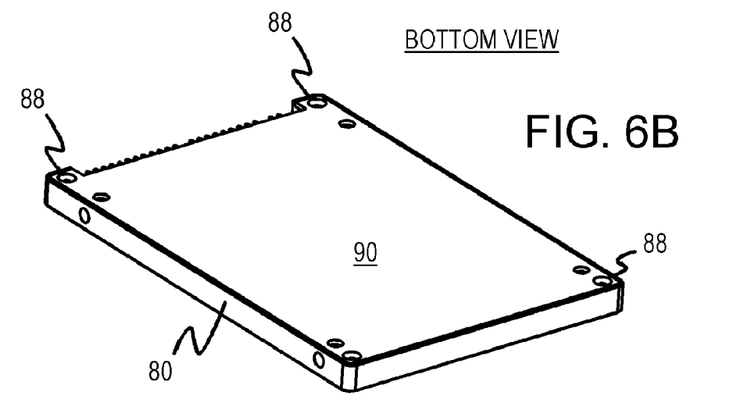
Figure 6C:
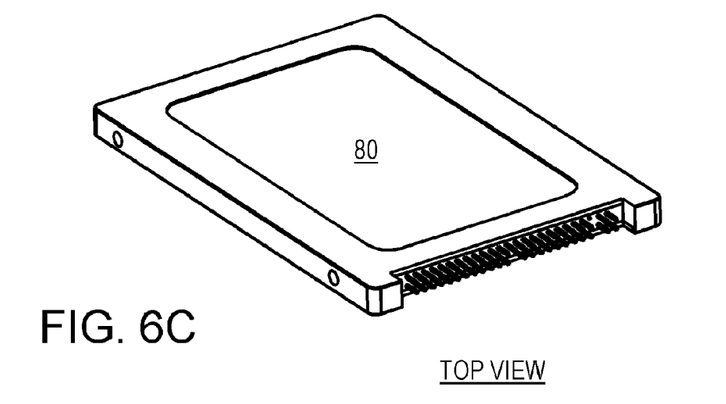

FIGS. 6A-C show a flash drive assembled using a snap-coupled process. In the parts view of FIG. 6A, PCBA 40 is enclosed by upper case 80 and lower case 90. PCBA 40 is a circuit board such as a PCB with wiring traces, and has several flash-memory chips 44 and other chips and components soldered to pads on surfaces of the circuit board. PCBA 40 also has connector 46 mounted and soldered to the front edge of the circuit board. Connector 46 has pins 42 that fit into IDE pin-sockets when the flash drive is plugged into a host.

During assembly, PCBA 40 is fitted inside upper case 80. Connector 46 has rectangular tabs 47 at both ends that are inserted into rectangular wells (not shown) formed on the interior of upper case 80. Rectangular tabs 47 fit snugly into the rectangular wells to keep PCBA 40 in position inside upper case 80 while lower case 90 is being screwed into to the assembly.

Lower case 90 has alignment rim 92 formed as a raised ridge on the topside of lower case 90. Alignment rim 92 fits inside the side walls of upper case 80 when lower case 90 is fitted into the sub-assembly of upper case 80 and PCBA 40. Screws are then inserted into four screw holes 94 at the four corners of lower case 90. The screws are driven in to screw holes in upper case 80 to fasten lower case 90 to upper case 80.

FIG. 6B shows a bottom view of the final assembled flash-drive device, with lower case 90 covering PCBA 40. The side walls visible are from upper case 80, since lower case 90 fits into upper case 80. Screws 88 have been driven into screw holes 94 in lower case 90 to secure lower case 90 to upper case 80.

FIG. 6C shows a top view of the final assembled flash-drive device, with upper case 80 covering PCBA 40. Pins 42 of connector 46 extend from a front opening between upper case 80 and lower case 90. The side walls visible are part of upper case 80. Pins 42 can be inserted into a socket such as an IDE socket on a host computer, and can be read as a mass-storage device, replacing a rotating hard disk.

Figure 7A:
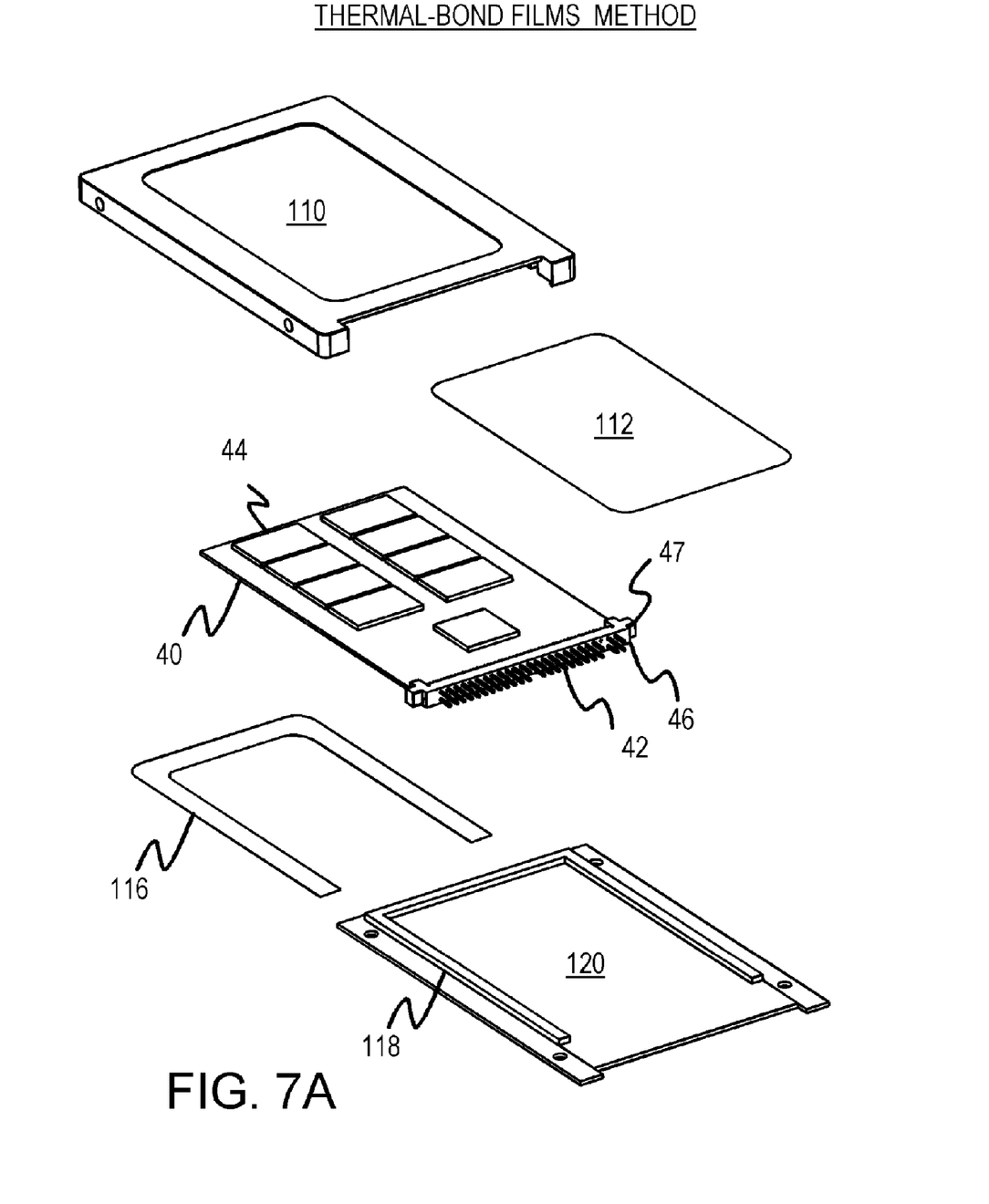
FIGS. 7A-C show a flash drive assembled using a thermal-bond adhesive process.
Figure 7B:
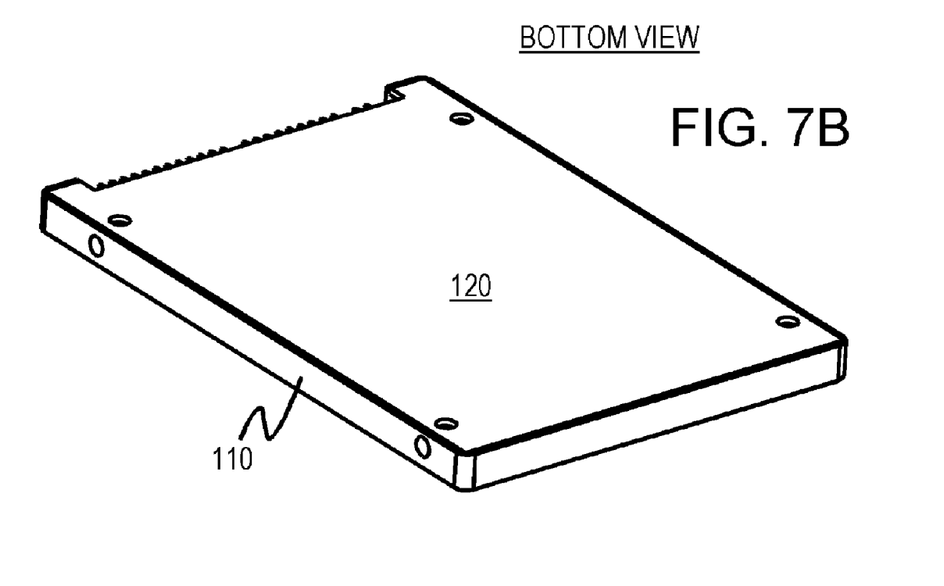
Figure 7C:
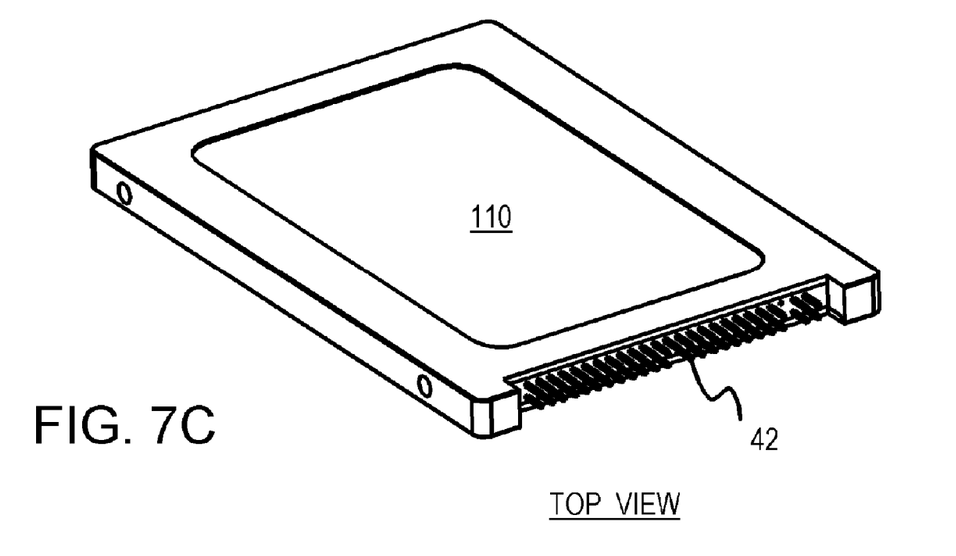

FIGS. 7A-C show a flash drive assembled using a thermal-bond adhesive process. Rather than use screws, contact layers of adhesive are used to secure the upper and lower cases together to enclose the PCBA. Upper adhesive film 112 bonds upper case 110 to PCBA 40, while lower adhesive film 116 bonds lower case 120 to upper case 110.

In the parts view of FIG. 7A, PCBA 40 is enclosed by upper case 110 and lower case 120. PCBA 40 is a circuit board such as a PCB with wiring traces, and has several flash-memory chips 44 and other chips and components soldered to pads on surfaces of the circuit board. PCBA 40 also has connector 46 mounted and soldered to the front edge of the circuit board. Connector 46 has pins 42 that fit into IDE pin-sockets when the flash drive is plugged into a host.

During assembly, upper adhesive film 112 is placed inside upper case 110, and PCBA 40 is fitted inside upper case 110. PCBA makes contact with upper adhesive film 112, such as on the tops of flash-memory chips 44.

Connector 46 has rectangular tabs 47 at both ends that are inserted into rectangular wells (not shown) formed on the interior of upper case 110. Rectangular tabs 47 fit snugly into the rectangular wells to keep PCBA 40 in position inside upper case 110 while lower case 120 is being added to the assembly.

Lower case 120 has alignment rim 118 formed as a raised ridge on the topside of lower case 120. Alignment rim 118 fits inside the side walls of upper case 110 when lower case 120 is fitted into the sub-assembly of upper case 110 and PCBA 40. Lower adhesive film 116 has a U-shape to cover alignment rim 118. Lower adhesive film 116 is placed over alignment rim 118 before lower case 120 is inserted into the sidewalls of upper case 110. Adhesive from lower adhesive film 116 thus covers the connection of alignment rim 118 to upper case 110.

Upper adhesive film 112 and lower adhesive film 116 can be a film with a heat-activated adhesive, such as a thermal-bond film (for example, product number TBF668 produced by 3M). The adhesive is then compressed between upper case 110, lower case 120, and flash-memory chips 44, and the assembly is held in the compressed state using a fixture. The fixture is then passed through an oven maintained at a specified temperature to activate or cure the adhesive. The oven temperature can be at or lower than the maximum safe operating temperature for the memory module components.

Connector 46 can be made from a high-temperature material such as a liquid crystal polymer with 30% glass fiber filled, or nylon 66 with 20% glass fiber filled, etc.). This allows connector 46 to withstand the heating process.

FIG. 7B shows a bottom view of the final assembled flash-drive device, with lower case 120 covering PCBA 40. The side walls visible are from upper case 110, since lower case 120 fits into upper case 110.

FIG. 7C shows a top view of the final assembled flash-drive device, with upper case 110 covering PCBA 40. Pins 42 of connector 46 extend from a front opening between upper case 110 and lower case 120. The side walls visible are part of upper case 110. Pins 42 can be inserted into a socket such as an IDE socket on a host computer, and can be read as a mass-storage device, replacing a rotating hard disk.

An advantage of heat-activated adhesives is that they can be removed by heating, and thus enable reworking of flash devices. To separate upper case 110 from lower case 120 during re-work, a heating machine with a temperature of about 150° C. may be used for several seconds to remove or loosen the adhesives.

Advantages of the flash hard drive include a compact size, light weight, low power consumption, the reliability of completely solid-state components with no moving parts. There is no mechanism for mechanical fatigue since the moving parts of the hard disk are replaced by flash-memory chips, which offer superb shock and vibration resistance.

ALTERNATE EMBODIMENTS

Several other embodiments are contemplated by the inventors. For example, while a connector and controller chip for IDE has been described, other bus protocols and physical connectors could be substituted, such as small-computer system interface (SCSI), compact flash, serial AT attachment (SATA), and PCI Express, ExpressCard, Firewire (IEEE 1394), etc.

The upper and lower cases could be formed from metal in some embodiments, such as when using screws, or could be plastic, such as for ultrasonic bonding. Combinations of plastic and metal could be used. The form factor for the flash-drive device could be designed to approximate 2.5-inch hard disk drives, or a smaller form factor for 1.8-inch, 1.3-inch, 1.0-inch, or other sizes could be substituted.

Directional terms such as upper, lower, up, down, top, bottom, etc. are relative and changeable as the device is rotated, flipped over, etc. These terms are useful for describing the device but are not intended to be absolutes. Some embodiments may have chips or other components mounted on only one side of the circuit board, while other embodiments may have components mounted on both sides. In some embodiments the upper case could be smaller than the bottom case, or vice-versa.

An alternative process to the above heat-activated adhesive film is to use high viscosity adhesives. The adhesive can be applied to the case surface by manual or automatic using dispensing machine. After dispensing adhesives onto the case surface, immediately press the case against PCBA. A press fixture may be used to hold the case and PCBA in position. The curing time is about several minutes.

Various combinations of the processes may be used. For example, the adhesive films of FIG. 7 may be used with the screw-together method of FIG. 6. Alignment sockets may be added to other embodiments. Center lines or more numerous ridges may be added to stiffen the upper or lower cases. Various cosmetic features, decals, and indicia may be added.

Rather than mount packaged IC's onto the surfaces of the circuit board, unpackaged die may be mounted using die-bonding techniques. Using unpackaged die rather than packaged die may reduce the size and weight of the PCBA.

Snap-tabs with movable latching teeth or extensions or locking portions may also be used in many variations. Different thicknesses and dimensions can be substituted for the examples given. The number and arrangement of chips may vary.

Various design features such as supporting underside ribs or bumps can be added. A variety of materials may be used for the connector, circuit boards, metal pads, cases, etc. Plastic cases can have a variety of shapes and may partially or fully cover different parts of the circuit board and connector, and can form part of the connector itself. Metal covers rather than plastic may be used in some embodiments. Various features can have a variety of shapes and sizes. Oval, round, square, rectangular, trapezoidal, and other shapes may be used.

Rather than use the flash-drive device only for flash-memory storage, additional features may be added. For example, a music player may include a controller for playing audio from MP3 data stored in the flash memory. An audio jack may be added to the device to allow a user to plug in headphones to listen to the music. A wireless transmitter such as a BlueTooth transmitter may be added to the device to connect to wireless headphones rather than using the audio jack. Infrared transmitters such as for IrDA may also be added. A BlueTooth transceiver to a wireless mouse, PDA, keyboard, printer, digital camera, MP3 player, or other wireless device may also be added. The BlueTooth transceiver could replace the connector as the primary connector. A Bluetooth adapter device could have a connector, a RF (Radio Frequency) transceiver, a baseband controller, an antenna, a flash memory (EEPROM), a voltage regulator, a crystal, a LED (Light Emitted Diode), resistors, capacitors and inductors. These components may be mounted on the PCB before being enclosed into a plastic or metallic enclosure.

A fingerprint scanner, display, keypad, power supply, or other accessories could be added to the flash-drive device with suitable changes to the casing to allow space and user access to these devices if needed. Alternately, the flash device may delete these components and just have input/output interface circuit 5, processing unit 2, and a flash memory device in the arrangement of FIG. 1. Power may be supplied through the connector. Input/output interface circuit 5 may be integrated with processing unit 2 as controller chip 45.

An indicator lamp such as an light-emitting diode (LED) could be added to the PCBA. The case may have an opening, thinning of the plastic, or a lens to allow light from the indicator lamp to shine through the case. A light pipe or light channel could be added.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A flash-memory drive comprising:
   an upper case;
   a lower case;
   a printed-circuit board assembly (PCBA) that comprises:
   a circuit board having wiring traces;
   a plurality of flash-memory chips mounted to the circuit board;
   a controller chip mounted to the circuit board, the controller chip having a input/output interface circuit for interfacing to an external computer, and a processing unit for accessing the plurality of flash-memory chips in response to commands from the external computer received by the input/output interface circuit;
   a connector mounted to the circuit board, for connecting the controller chip to the external computer;
   wherein the upper case is attached to the lower case during assembly with the PCBA between the upper case and the lower case, with the connector passing through an opening between the upper case and the lower case, the upper and lower cases encapsulating the circuit board,
   wherein the plurality of flash-memory chips are block-addressable and not randomly-addressable;
   wherein the connector is an integrated device electronics (IDE) connector or a small-computer system interface (SCSI) connector.

2. A flash-memory drive comprising:
   an upper case;
   a lower case;
   a printed-circuit board assembly (PCBA) that comprises:
   a circuit board having wiring traces;
   a plurality of flash-memory chips mounted to the circuit board;
   a controller chip mounted to the circuit board, the controller chip having a input/output interface circuit for interfacing to an external computer, and a processing unit for accessing the plurality of flash-memory chips in response to commands from the external computer received by the input/output interface circuit;

a connector mounted to the circuit board, for connecting the controller chip to the external computer;

wherein the upper case is attached to the lower case during assembly with the PCBA between the upper case and the lower case, with the connector passing through an opening between the upper case and the lower case, the upper and lower cases encapsulating the circuit board, wherein the plurality of flash-memory chips are block-addressable and not randomly-addressable;

wherein the connector is a compact flash, serial AT attachment (SATA), PCI Express, ExpressCard, or Firewire (IEEE 1394) connector.

3. The flash-memory drive of claim 1 further comprising:
end tabs formed on ends of the connector;
pins on the connector for inserting into pin sockets on the external computer;
end wells formed on the lower case, for receiving the end tabs of the connector and aligning the PCBA to the lower case when the PCBA is inserted into the lower case during assembly,
whereby the end tabs and end wells align the PCBA to the lower case during assembly.

4. The flash-memory drive of claim 3 wherein the plurality of flash-memory chips comprise chips mounted to a top surface of the circuit board and chips mounted to a bottom surface of the circuit board;
wherein the pins on the connector comprise a top row of pins and a bottom row of pins;
wherein connector is mounted to an edge of the circuit board wherein the top row of pins is above a center-line of the circuit board and the bottom row of pins is below the center-line of the circuit board,
whereby the connector straddles the edge of the circuit board for a balanced PCBA design.

5. The flash-memory drive of claim 3 wherein the plurality of flash-memory chips are arranged into rows of chips;
further comprising:
center lines, formed on an inside of the upper case, for increasing rigidity of the upper case, the center lines fitting between the rows of chip when assembled;
center lines, formed on an inside of the lower case, for increasing rigidity of the lower case, the center lines fitting between the rows of chip when assembled,
whereby case rigidity is increased by the center lines between the rows of chips.

6. The flash-memory drive of claim 5 further comprising:
locking tabs formed on sidewalls of the lower case;
engagement slots formed on sidewalls of the upper case;
wherein the locking tabs snap into the engagement slots during assembly to lock the upper case into the lower case;
whereby the upper case and the lower case are assembled by a snap-together method.

7. The flash-memory drive of claim 6 further comprising:
alignment pegs formed on sidewalls of the upper case;
alignment sockets formed on sidewalls of the lower case;
wherein the alignment pegs fit into the alignment sockets during assembly to align the upper case to the lower case;
whereby the upper case and the lower case are aligned during assembly.

8. The flash-memory drive of claim 4 further comprising:
an ultrasonic ridge formed on the upper case, for touching and melting into the lower case during assembly when the upper case is vibrated with ultrasonic energy with respect to the lower case,
whereby the upper case and the lower case are bonded by ultrasonic energy absorbed by the ultrasonic ridge.

9. The flash-memory drive of claim 8 further comprising:
alignment cutouts formed on the upper case;
alignment tabs formed on the lower case, the alignment tabs fitting into the alignment cutouts during assembly,
whereby the upper case and the lower case are aligned during assembly.

10. The flash-memory drive of claim 4 further comprising:
an alignment rim formed on the lower case, the alignment rim shaped to fit within sidewalls of the upper case during assembly;
whereby the alignment rim aligns the upper case to the lower case during assembly.

11. The flash-memory drive of claim 10 further comprising:
screw fasteners, inserted into holes in the upper case and in the lower case, to fasten together the upper case and the lower case during assembly,
whereby the upper case and the lower case are screwed together.

12. The flash-memory drive of claim 10 further comprising:
an upper adhesive film disposed between the PCBA and the upper case during assembly;
a lower adhesive film disposed between the PCBA and the alignment rim of the lower case during assembly;
whereby the upper adhesive film bonds the upper case to the PCBA and the lower adhesive film bonds the lower case to the upper case during assembly.

13. The flash-memory drive of claim 12 wherein the upper adhesive film and the lower adhesive film are thermally activated by an elevated temperature.

14. A flash-memory device comprising:
upper case means for partially encasing the flash-memory device;
lower case means for partially encasing the flash-memory device;
a printed-circuit board assembly (PCBA) that comprises:
circuit board means for connecting chips with wiring traces;
a plurality of flash-memory chip means for storing blocks of data, the plurality of flash-memory chip means being mounted to the circuit board means, wherein the plurality of flash-memory chip means are block-addressable and not randomly-addressable;
controller chip means, mounted to the circuit board means, for controlling access to the plurality of flash-memory chip means, the controller chip means comprising an input/output interface means for interfacing to an external computer, and processing unit means for accessing the plurality of flash-memory chip means in response to commands from the external computer received by the input/output interface means; and
connector means, mounted to the circuit board means, for connecting the controller chip means to the external computer;
wherein the upper case means is attached to the lower case means during assembly with the PCBA between the upper case means and the lower case means, with the connector means passing through an opening between the upper case means and the lower case means.

15. The flash-memory device of claim 14 further comprising:
ultrasonic ridge means, formed on the upper case means, for touching the lower case means when ultrasonic energy is applied while pressing the upper case means into the lower case means, the ultrasonic ridge means for ultrasonically bonding the upper case means into the lower case means whereby the upper case means is ultrasonically bonded to the lower case means by the ultrasonic ridge means.

16. The flash-memory device of claim 14 further comprising:

locking tab means, formed on the lower case means, for locking the lower case means to the upper case means during assembly;

engagement slot means, formed on the upper case means, for receiving the locking tab means on the lower case means when the lower case means is inserted into the upper case means, the engagement slot means for engaging the locking tab means;

whereby the upper case means is snap-coupled to the lower case means by the locking tab means.

* * * * *